United States Patent
Kikuchi et al.

(10) Patent No.: US 9,538,691 B2
(45) Date of Patent: Jan. 3, 2017

(54) POWER INVERTER FOR A VEHICLE

(71) Applicant: Ford Global Technologies, LLC, Dearborn, MI (US)

(72) Inventors: Jun Kikuchi, Novi, MI (US); Guangyin Lei, Dearborn Heights, MI (US); Ming Su, Canton, MI (US); Tienli Wang, Troy, MI (US); Edward Chan-Jiun Jih, Troy, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 14/687,380

(22) Filed: Apr. 15, 2015

(65) Prior Publication Data

US 2016/0309614 A1   Oct. 20, 2016

(51) Int. Cl.
*H05K 7/20*     (2006.01)
*H01L 23/473*   (2006.01)

(52) U.S. Cl.
CPC .................................. *H05K 7/2089* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........... 361/676–678, 679.46–679.54, 688–723,361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 6,297,956 B1 * | 10/2001 | Janik | G06F 1/1615 361/679.47 |
| 7,835,151 B2 | 11/2010 | Olesen | |
| 8,248,809 B2 | 8/2012 | Miller et al. | |
| 8,609,268 B2 | 12/2013 | Fuhr et al. | |
| 8,835,036 B2 | 9/2014 | Sohn | |
| 2005/0259402 A1 * | 11/2005 | Yasui | H02M 7/003 361/716 |
| 2006/0007720 A1 * | 1/2006 | Pfeifer | H05K 7/20927 363/141 |
| 2008/0002358 A1 * | 1/2008 | Casebolt | G06F 1/20 361/679.49 |
| 2008/0179972 A1 * | 7/2008 | Aoki | H01L 21/4878 310/52 |
| 2008/0192430 A1 * | 8/2008 | Brandenburg | H01L 23/467 361/695 |
| 2008/0251909 A1 | 10/2008 | Tokuyama et al. | |
| 2009/0021971 A1 * | 1/2009 | Korich | H05K 7/20927 363/141 |

(Continued)

OTHER PUBLICATIONS

Products for Electric and Hybrid Vehicles, Mar. 25, 2015, 13 pgs.

*Primary Examiner* — Anthony Haughton
*Assistant Examiner* — Razmeen Gafur
(74) *Attorney, Agent, or Firm* — David B. Kelley; Brooks Kushman P.C.

(57) ABSTRACT

A power inverter includes a plurality of power modules stacked in an array. A plurality of coolant chambers are interleaved with the modules. Each of the chambers includes an inlet and an outlet interconnected by a coolant path configured to circulate coolant within the chamber. Fins project into the coolant path and are configured to alter shape based on a temperature of the coolant to alter a turbulence associated with the coolant.

20 Claims, 8 Drawing Sheets

(56) References Cited

U.S. PATENT DOCUMENTS

| | | | |
|---|---|---|---|
| 2009/0231810 A1* | 9/2009 | Liang | H01L 23/473 361/699 |
| 2009/0250195 A1* | 10/2009 | Yoshida | F28F 3/02 165/80.3 |
| 2009/0262501 A1* | 10/2009 | Claassen | G06F 1/20 361/701 |
| 2010/0103618 A1* | 4/2010 | Campbell | H05K 7/20772 361/699 |
| 2012/0127668 A1* | 5/2012 | Yamamoto | H01L 21/565 361/715 |
| 2012/0244404 A1 | 9/2012 | Obasih et al. | |
| 2012/0287577 A1* | 11/2012 | Sevkivi | H01L 23/473 361/702 |
| 2012/0327603 A1* | 12/2012 | Beaupre | H01L 23/473 361/702 |
| 2013/0050944 A1* | 2/2013 | Shepard | H01L 23/473 361/703 |
| 2013/0107455 A1* | 5/2013 | Cottet | H05K 7/20672 361/694 |
| 2013/0135824 A1* | 5/2013 | Harubeppu | H01L 23/34 361/709 |
| 2013/0258594 A1* | 10/2013 | Gradinger | F28D 15/02 361/700 |
| 2013/0258596 A1* | 10/2013 | Sharaf | H05K 7/20927 361/702 |
| 2014/0133091 A1* | 5/2014 | Shah | H05K 7/1488 361/679.48 |
| 2014/0140004 A1* | 5/2014 | Kubo | H01L 23/3672 361/699 |
| 2014/0198453 A1* | 7/2014 | Zhang | H01L 23/473 361/699 |
| 2014/0268546 A1* | 9/2014 | Mayhall | G06F 1/20 361/679.47 |
| 2014/0268554 A1* | 9/2014 | Dunwoody | G06F 1/20 361/679.54 |
| 2014/0340845 A1* | 11/2014 | Straznicky | H05K 7/20 361/689 |

* cited by examiner

FIG. 16A      FIG. 16B

POWER INVERTER FOR A VEHICLE

TECHNICAL FIELD

The present disclosure relates to power inverters for automotive vehicles and specifically to power inverters having a power-module assembly with cooling fins.

BACKGROUND

Vehicles such as battery-electric vehicles (BEVs), plug-in hybrid electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a power inverter includes a plurality of power modules stacked in an array. A plurality of coolant chambers are interleaved with the modules. Each of the chambers includes an inlet and an outlet interconnected by a coolant path configured to circulate coolant within the chamber. Fins project into the coolant path and are configured to alter shape based on a temperature of the coolant to alter a turbulence associated with the coolant.

According to another embodiment, a power inverter includes a plurality of power modules having opposing major sides that each define a pocket recessed therein. The power modules are arranged in a stack such that pockets adjacent to each other cooperate to form coolant chambers interleaved with the modules. A plurality of flow guide assemblies are each disposed within one of the coolant chambers and includes fins arranged to direct coolant flow within the chambers.

According to yet another embodiment, a cooling device for a power-electronics assembly includes a substrate and fins projecting outwardly from the substrate. The fins are configured to alter shape based on a temperature of coolant flowing through the cooling device and past the fins to alter a turbulence associated with the coolant.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
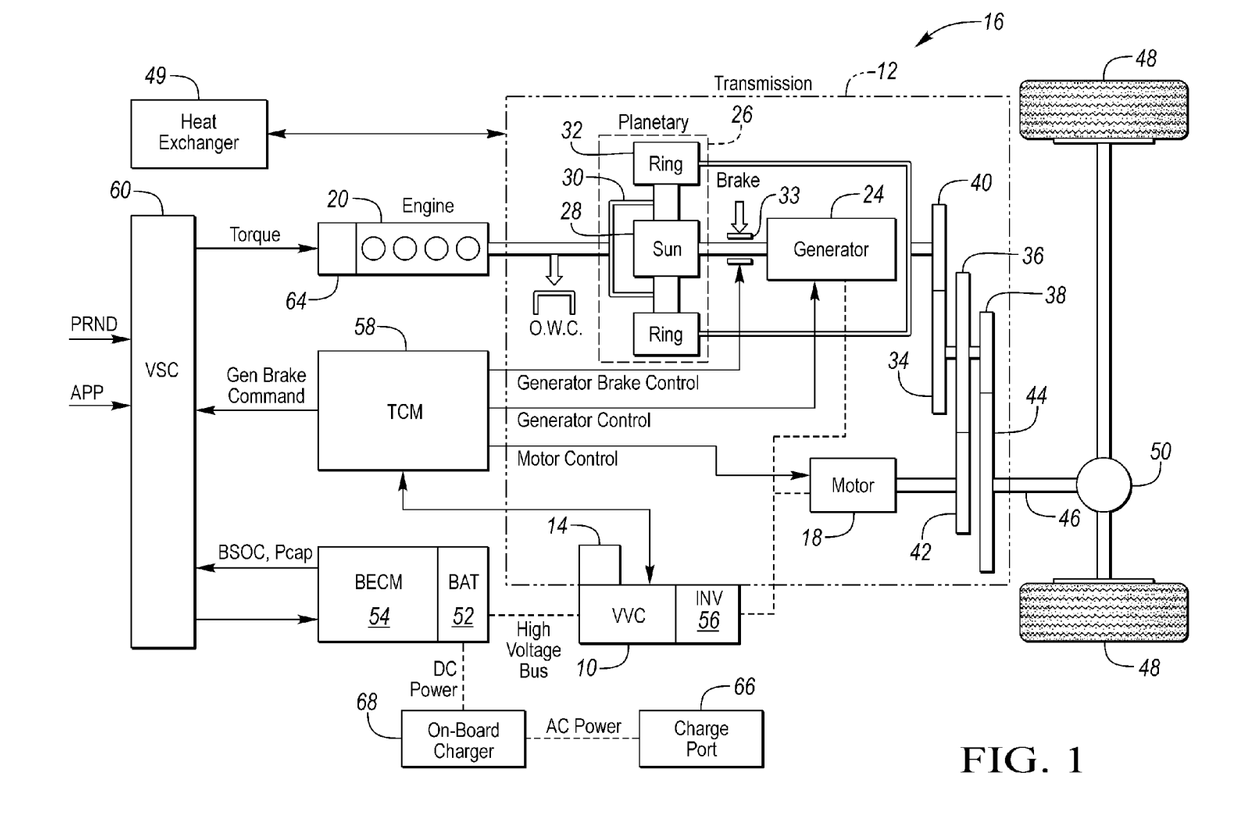
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with assistance from an internal combustion engine 20. The electric machine 18 may be an AC electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 includes a planetary gear unit 26, which includes a sun gear 28, a planet carrier 30 and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 includes a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48. The transmission also includes a heat exchanger or automatic transmission fluid cooler 49 for cooling the transmission fluid.

The vehicle 16 includes an energy storage device, such as a traction battery 52 for storing electrical energy. The battery 52 is a high voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the main battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
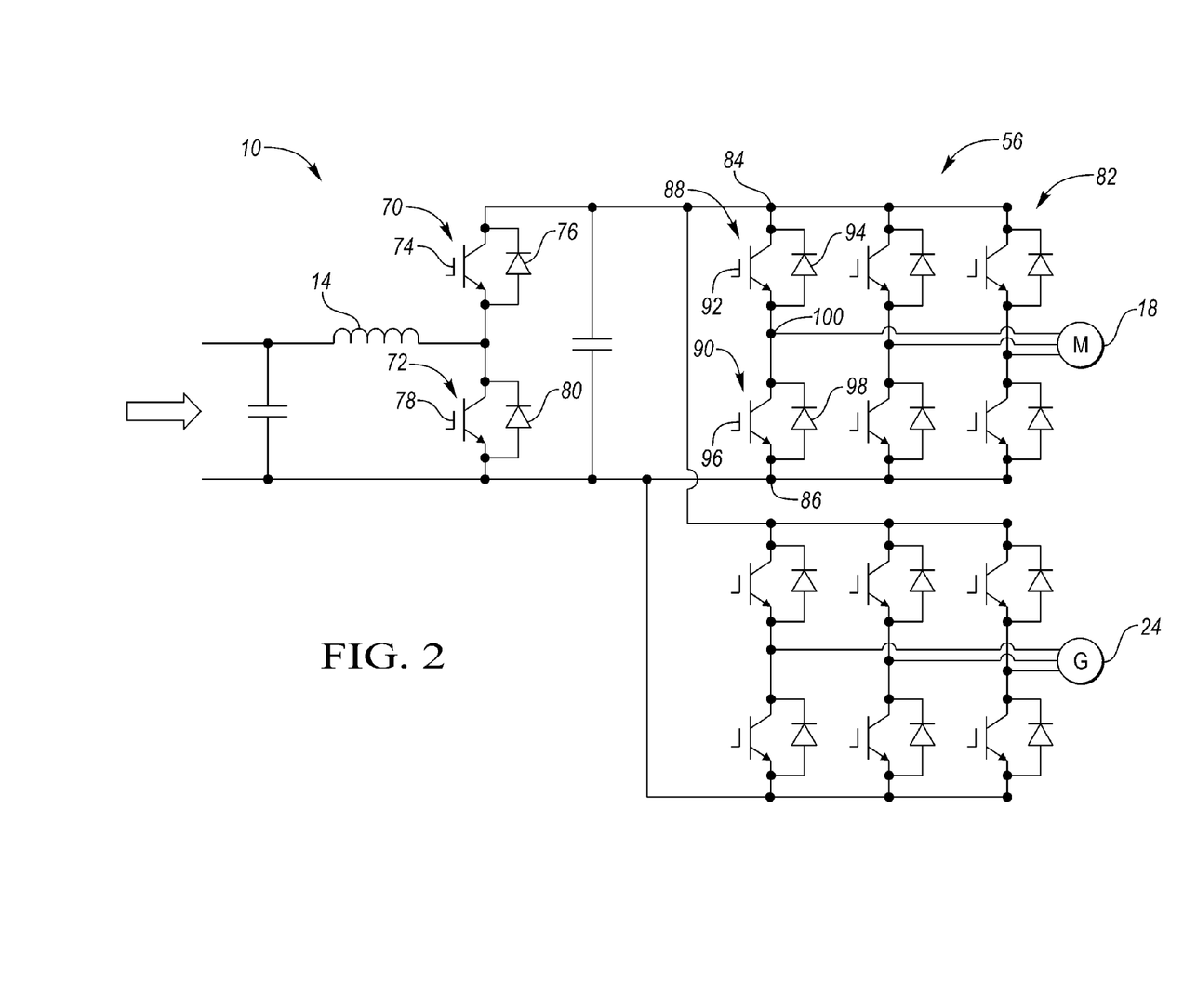
FIG. 2 is a schematic diagram of a variable voltage converter and a power inverter.

Referring to FIG. 2, an electrical schematic of the VVC 10 and the inverter 56 is shown. The VVC 10 may include a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations (e.g., more than two switches).

The inverter 56 may include a plurality of half-bridges 82 that are stacked in an assembly. Each of the half-bridges may be packaged as a power stage. In the illustrated embodiment, the inverter 56 includes six half-bridges, three for the motor 18 and three for the generator 24. Each of the half bridges 82 may include a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in parallel to a first diode 94. The second switching unit 90 may include a second transistor 96 connected in parallel to a second diode 98. The first and second transistors 88, 96 may be IGBTs or FETs. The first and second switching units 88, 90 of the each of the half-bridges 82 convert the DC power of the battery into a single phase AC output at the AC lead 100. Each of the AC leads 100 are electrically connected to the motor 18 or generator 24. In the illustrated example, three of the AC leads 100 are electrically connected to the motor 18 and the other three AC leads 100 are electrically connected to the generator 24.

Figure 3:
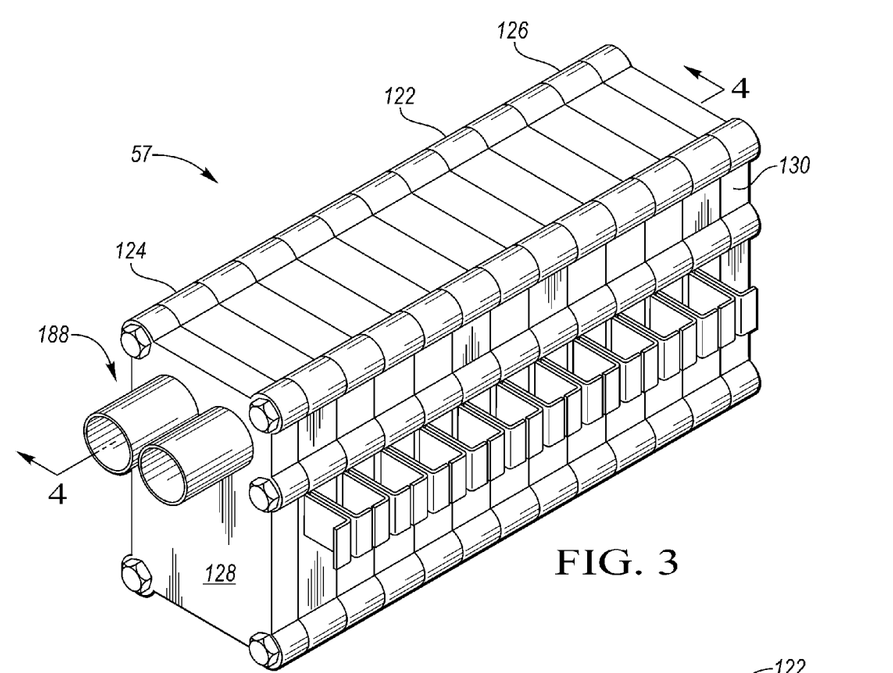
FIG. 3 is a perspective view of a power-module assembly.
Figure 4:
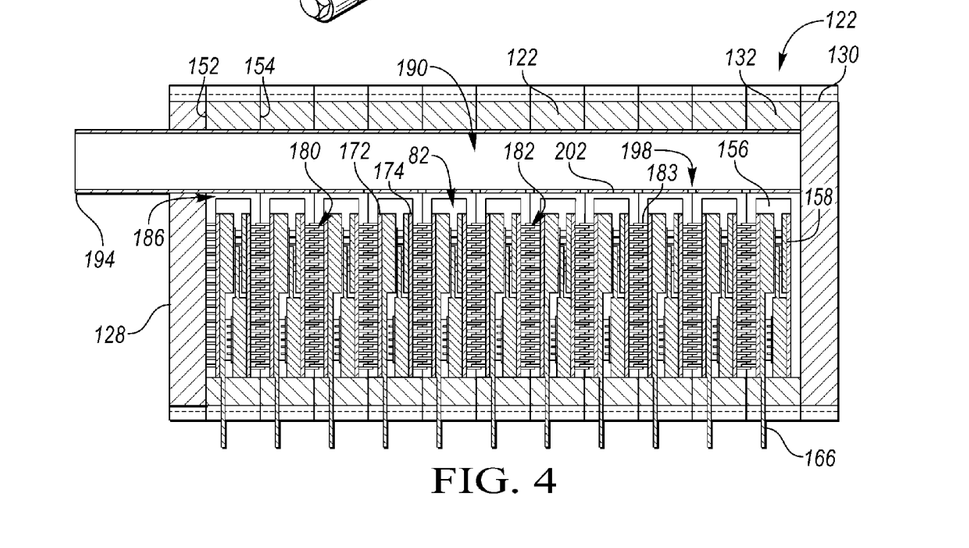
FIG. 4 is a side view, in cross-section, of the assembly of FIG. 3 along cut line 4-4.
Figure 5:
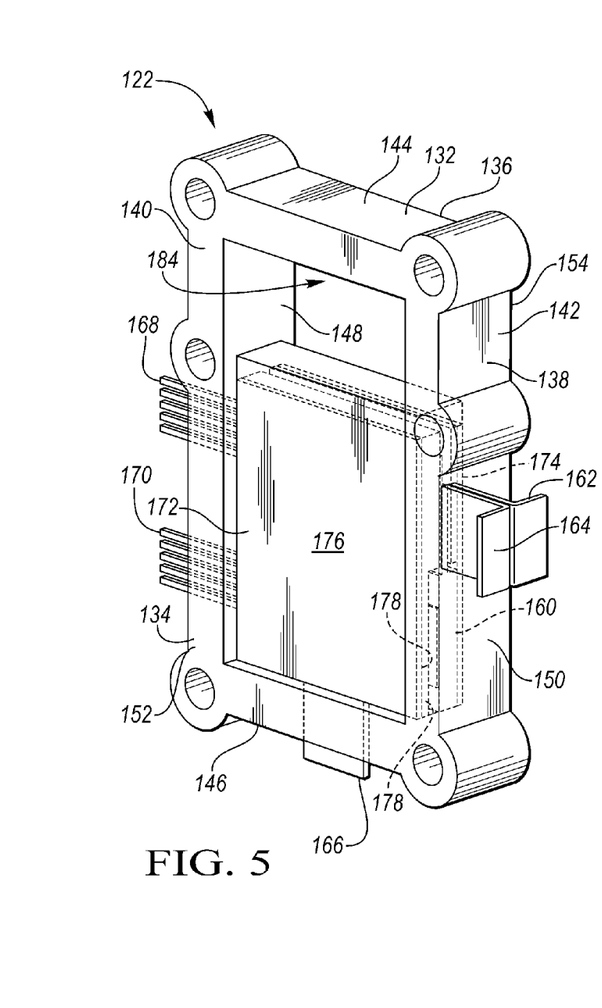
FIG. 5 is a perspective view of one of the modules of the assembly shown in FIG. 3.

Referring to FIGS. 3 through 5, the power inverter 56 includes a power-module assembly 57, a capacitor module (not shown) and a gate drive board (not shown). The power-module assembly 57 includes a plurality of power modules 122 arranged in a stack. The power-module assembly 57 includes a first power module 124 defining one end of the stack and a last power module 126 defining the other end of the stack. A first end plate 128 is disposed against the first module 124, and a second endplate 130 is disposed against the last module 126. The endplates cooperate to sandwich the stack and may provide compression to help hold the stack together.

Each of the power modules 122 includes a frame 132 having opposing major sides 134, 136 and minor sides 138 extending therebetween. In the illustrated embodiment, the frame 132 is a hollow rectangular body including a left side 140, a right side 142, a top 144, and a bottom 146 that all cooperate to define an exterior surface 150, an interior surface 148, a front surface 152, and a back surface 154. The frame 132 may be a different shape in other embodiments. The interior surface 148 defines an enclosure for receiving the power stage 82. The power stage 82 may include semiconductor devices as is shown in FIG. 2.

The power stage 82 includes opposing major sides 158 and a plurality of minor sides 160. The power stage 82 is received within the enclosure and is surrounded by the frame 132 on at least some of the minor sides 160. The power stage 82 includes a positive DC power terminal 162 and a negative DC power terminal 164 that each extend through one or more holes defined in the right side 142. Each of the DC terminals 164 may be connected to corresponding terminals of the capacitor module. An AC power terminal 166 of the power stage 82 extends through a hole defined in the bottom 146. The AC power terminals 166 are electrically connected to the electric machines. First and second signal pins 168, 170 of the power stage 82 extend through one or more holes defined in the left side 140. The signal pins 168, 170 may be electrically connected to the gate drive board. The location of the terminals and signal pins may vary by embodiment and are not limited to the configuration shown. A first plate 172 is disposed against one of the major sides 158 of the power stage 82, and a second plate 174 is disposed against the other major side of the power stage 82. The first and second plates 172, 174 are arranged in the frame 132 such that the outer side panels 176 are exposed and at least some of the edges 178 engage the interior surface 148 of the frame 132. The first and second plates 172, 174 may be metallic, plastic, composite, or a combination thereof. The semiconductor devices of the power stage 82 may be filled with an epoxy 156 or other filler to electrically insulate the power stage from the plates and other components. Note: The epoxy is not cross-hatched for clarity.

The minor sides 138 of the frame 132 are wide enough to extend past the outer panel sides 176 of the plates 172, 174 in the longitudinal direction of the stack. The extended region of the frame 132 and the panel 176 of each plate define a pair of pockets 180 recessed into the major sides of the power module 122. Each of the power modules 122 also includes an opening 184 defined between the frame 132 and the power stage 82. A divider may be disposed within the opening 184 to partition the opening 184 into a pair of sided-by-side openings.

As is best shown in FIG. 4, the individual power modules 122 are arranged in a stack with the front and back surfaces 152, 154 of adjacent frames 132 being disposed against each other. When stacked, the pockets 180 of adjacent power modules 122 cooperate to define coolant chambers 182 interleaved with the modules 122. The endplates and the power modules may also cooperate to define some of the coolant chambers 182. For example, the first endplate 128 cooperates with the first module 124 to define an outer coolant chamber, and the second endplate 130 cooperates with the last module 126 to define another outer coolant chamber. The outer coolant chambers may have a smaller volume than the interior coolant chambers, or the endplates may have a recessed area to provide outer coolant chambers having a same or similar volume as the interior coolant chambers. Alternatively, the outer coolant chambers may be omitted. For example, each of the endplates 128, 130 may include a protruding face that is received within the outer pocket of the first and last modules 124, 126 to fill the pocket. Each of the coolant chambers 182 may be bounded on five sides and may have an open top side. In other embodiments, each chamber is bounded on four sides having an open top and an open bottom. Each of the coolant chambers 182 may include channeling or other features to guide coolant circulating within the chamber. For example, a plurality of fins 183, are attached to the plates 172, 174 and extend outwardly therefrom into the chamber 182. Each power stage may include fins 183 projecting from one or both plates 172, 174. The fins 183 create turbulence in the coolant flowing within the chamber to increase the cooling capacity of the chamber. In another embodiment, the fins may be variable shaped fins configured to change shape in response to a change in temperature. The variable shaped fins are attached to a corresponding plate such that at least a portion of the fin is displaceable relative to the plate. By changing the shape of the fins, the amount of turbulence created in the coolant can be modulated as needed.

Figure 6:
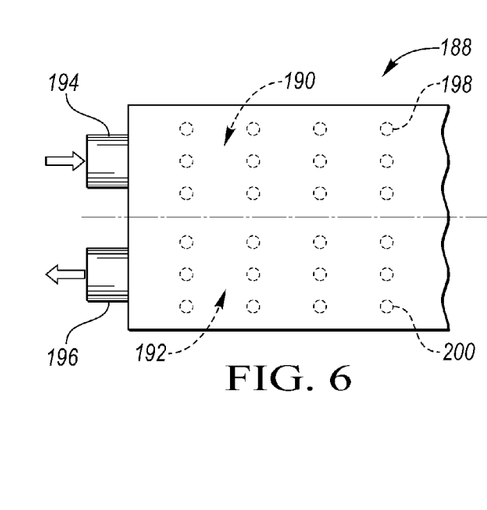
FIG. 6 is a top view of a manifold of the assembly shown in FIG. 3.

Referring to FIGS. 4 and 6, the openings 184 in each of the modules 122 cooperate forming a cavity 186 that extends along a length of the stack. The open top side of each of the coolant chambers 182 may open into the cavity 186. A manifold 188 is received within the cavity 186 and extends along a length of the inverter 56. The manifold 188 may include a supply chamber 190 and a return chamber 192. The chambers may be on opposite sides of the divider. In the illustrated embodiment, the supply chamber and the return chamber are positioned side-by-side, however other configurations are contemplated. The supply chamber 190 includes a port 194 that connects with a supply line, and the return chamber 192 includes a port 196 that connects with a return line. The supply and return lines form part of a larger thermal management system that may include pumps, radiators, other lines, valves, and other components. A bottom wall 202 of the manifold 188 is disposed over the open top side of each of the coolant chambers 182. The bottom wall 202 of the manifold 188 may act as a ceiling for the coolant chambers 182. The bottom wall 202 may include a plurality of inlets 198 in the supply chamber 190 placing the supply chamber 190 in fluid communication with each of the coolant chambers 182. The bottom wall 202 may include a plurality of outlets 200 in the return chamber 192 placing the return chamber in fluid communication with each of the coolant chambers 182. During operation, pressurized coolant in the supply chamber 190 is circulated into each of the coolant chambers 182 to cool the power modules 122. The coolant exits from the coolant chambers 182 into the return chamber 192 via the outlets 200. The fins 183 within each of the coolant chambers 182 help guide fluid between the inlets 198 and the outlets 200. The divider helps prevent coolant flowing directly from an outlet 198 to an inlet 200 without flowing through the coolant chamber 182.

Figure 7:
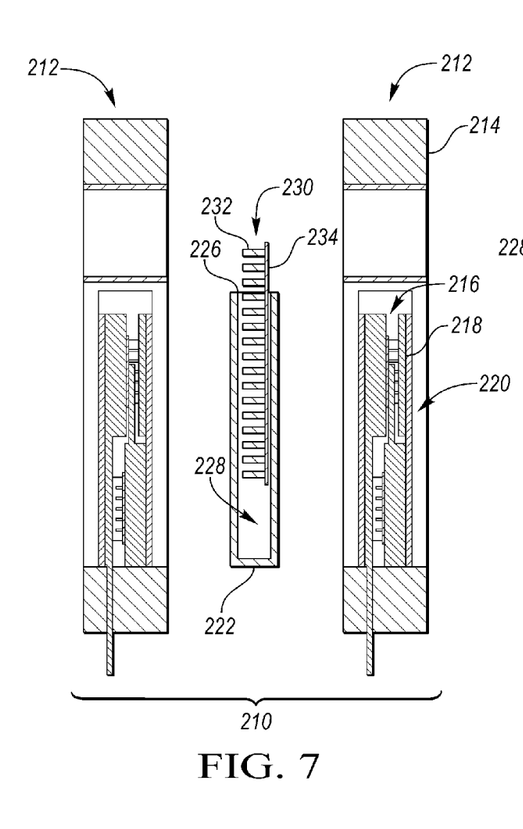
FIG. 7 is an exploded side view of a portion of another power-module assembly.

Referring to FIG. 7, an exploded view of a portion of another power-module assembly 210 is illustrated. The assembly 210 includes a plurality of modules 212 stacked in an array. Each module 212 is similar to module 122 and includes a frame 214 and a power stage 216 arranged within the frame. Plates 218 are attached to the outer surface of the power stage 216 and cooperate with the frame 214 to define a pocket 220 on each side of the module 212. Unlike power-module assembly 57 (where the pockets 180 directly defined the coolant chambers 182), assembly 210 includes a plurality of housings 222 that each define one of the coolant chambers 228. Each of the housings 222 includes walls 224 that define the coolant chamber 228. The housing 222 includes an opening 226 that allows coolant to be circulated into and out of the chamber 228. A flow guide assembly 230 is received within the chamber 228. The flow guide assembly includes a plurality of fins 232 that may be attached to a backing plate 234. The fins are sized and shaped to extend across at least a portion of the coolant chamber 228. The fins 232 may be arranged in different patterns to create a desired coolant flow path within the chamber 228. The fins 232 may be stationary fins or may be variable shaped fins.

Figure 8:
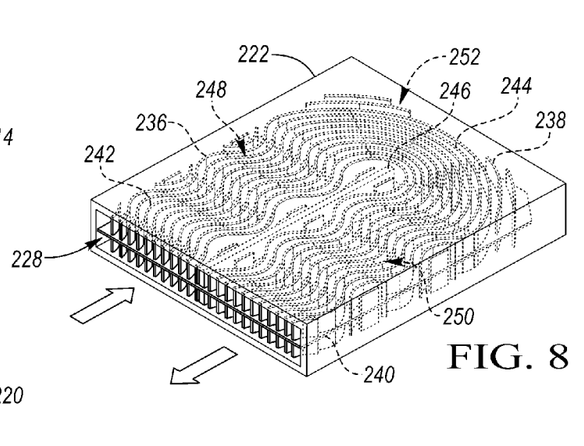
FIG. 8 is a perspective view of a wavy flow guide assembly.
Figure 9:
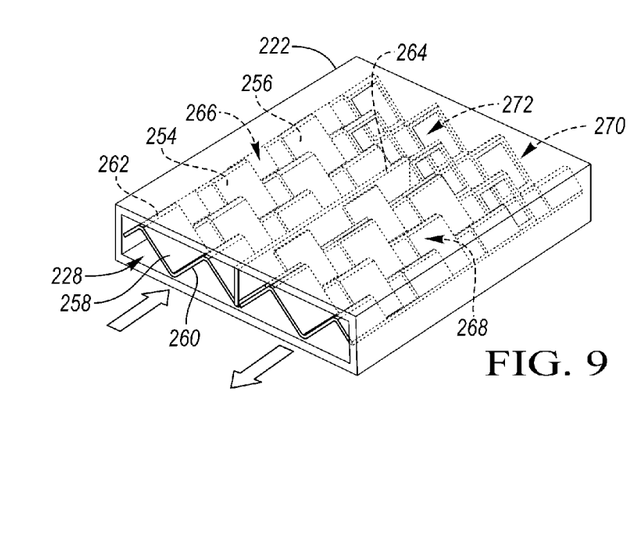
FIG. 9 is a perspective view of an off-set strip flow guide assembly.
Figure 10:
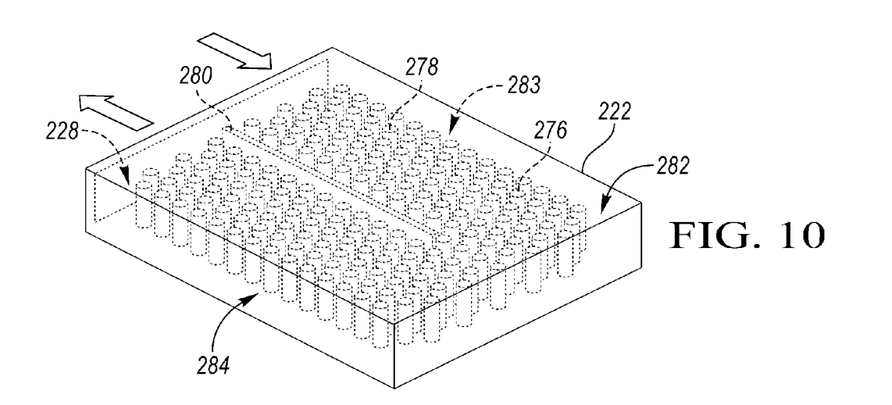
FIG. 10 is a perspective view of a pin fin flow guide assembly.

FIGS. 8 through 10 illustrate different flow guide assemblies. The flow guide assemblies are illustrated and described in conjunction with the housing embodiment of FIG. 7. But, any of the flow guide assemblies are also applicable with power-module assembly 57. In embodiments not including the housing, the flow guide assemblies may be attached to one or both of the plates 172, 174.

Referring to FIG. 8, a wavy flow guide assembly 236 is disposed within the coolant chamber 228 of the housing 222. The assembly 236 includes a plurality of wavy fins 238 that may be attached to a mid-plate 240. A barrier 246 extends along a portion of the assembly 236 to define inlet and outlet sides 248, 250 of the chamber 228. A return region 252 of the chamber 228 connects with both the inlet and outlet sides. Some of the wavy fins are continuous having a pair of relatively straight sections 242 interconnect by a U-shaped section 244. The straight sections 242 are disposed in one of the inlet and outlet sides 248, 250, and the U-shaped section 244 is disposed in the return portion 252. In the embodiment shown in FIG. 8, fluid enters and exits the chamber 228 at a same side of the housing 222.

Referring to FIG. 9, an off-set strip flow guide assembly 254 is disposed within the coolant chamber 228 of the housing 222. The assembly 254 includes a plurality of corrugated strips 256 arranged within the chamber 228. Each of the strips 256 include at least a first panel 258 and a second panel 260 interconnected at bent edge 262. A barrier 264 extends along a portion of the assembly 254 to define inlet and outlet sides 266, 268. A return region 270 connects with both the inlet and outlet sides. The corrugated strips 256 disposed within the return region 270 may include panels having holes 272 allowing coolant to change directions within the return region 270.

Referring to FIG. 10, a pin fin flow guide assembly 276 is disposed within the coolant chamber 228 of the housing 222. The assembly 276 includes a plurality of pin fins 278. The pin fins 278 may be arranged in rows as is illustrated, or may be randomly arranged. A barrier 280 extends along a portion of the assembly 276 to define inlet and outlet sides 283, 284. A return region 282 connects with both the inlet and outlet sides. The pins 278 may be arranged in U-shaped rows within the return region 282. The pins 278 may have a circular cross-section or may have a polygonal cross-section.

Figure 11:
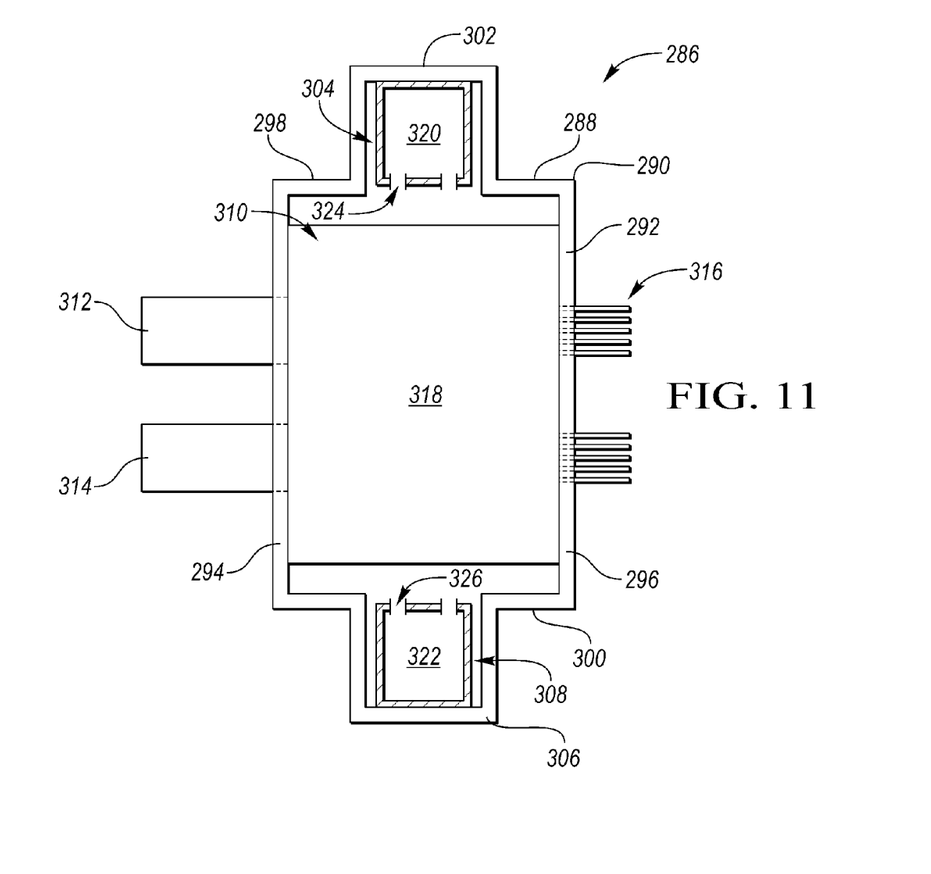
FIG. 11 is a front view, in cross-section, of another power-module assembly.

Referring to FIG. 11, a cross-sectional view of another power-module assembly 286 is illustrated. The assembly 286 includes a plurality of power modules 288 having a frame 290 with a front face 292 and a back face (not visible). In the illustrated embodiment, the frame 290 also includes a left side 294, a right side 296, a top 298 and a bottom 300. An upper protruding portion 302 extends upwardly from the top 298 and defines a cavity 304. A lower protruding portion 306 extends downwardly from the bottom 300 and defines a cavity 308.

A power stage 310 is received within the frame 290. The power stage includes major sides not covered by the frame and minor sides that are surrounded by an interior surface of the frame 290. The power stage 310 includes a pair of positive and negative DC terminals 312 extending through the left side 294, and an AC terminal 314 extending through the left side 294. The pair of positive and negative DC terminals 312 are stacked next to each other and only one of them is visible in the figure. Signal pins 316 of the power stage 310 extend through the right side 296. The terminals and signal pins may be placed in different locations in other embodiments. Plates 318 are disposed on each of the major sides of the power stage 310. The frame 290 is sized to extend past the plates forming a pocket. Adjacent pockets cooperate to form coolant chambers as described above. An inlet manifold 320 is received within the upper cavity 304 and an outlet manifold 322 is received within the lower cavity 308. The manifold may be slightly smaller than the cavity (as shown) or may be substantially the same size. The inlet and outlet manifolds are in fluid communication with each of the coolant chambers via inlets 324 and outlets 326. During operation of the cooling system, fluid flows from the inlet manifold 320, across the power stage 310, and out via the outlet manifold 322 to cool the power stage 310. As illustrated, the upper and lower protruding portions and the upper and lower manifolds are centered on the centerline of the frame 290. But, in other embodiments, the protruding portions and manifolds may be offset to the left, or to the right, of the centerline.

Figure 12:
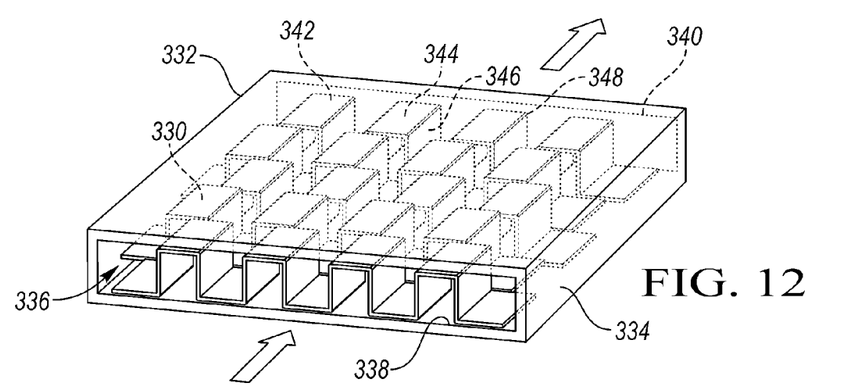
FIG. 12 is a perspective view of another off-set strip flow guide assembly.
Figure 13:
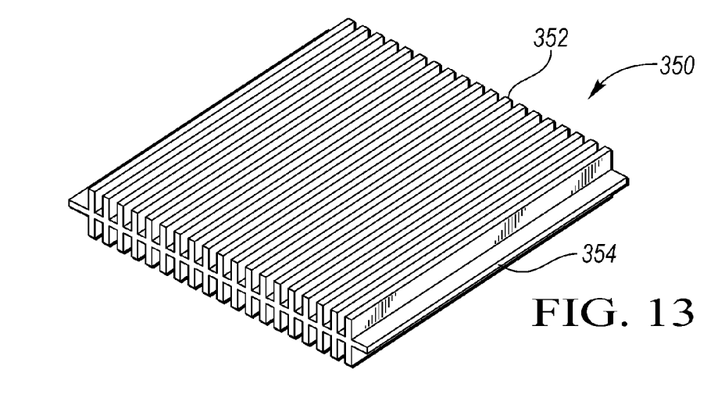
FIG. 13 is a perspective view of a straight fin flow guide assembly.
Figure 14:
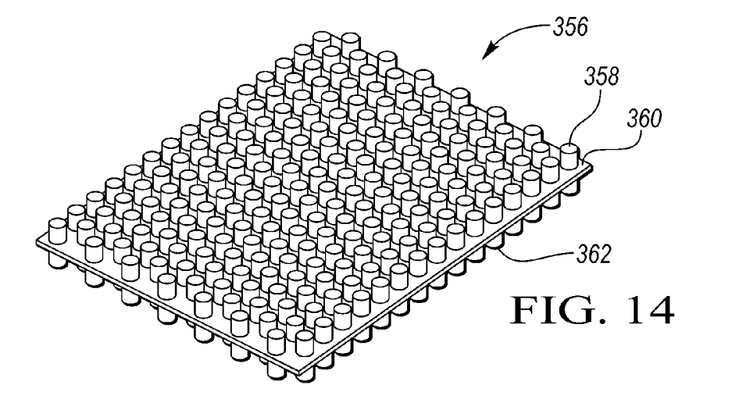
FIG. 14 is a perspective view of another pin fin flow guide assembly.

The coolant chambers of assembly 286 may be defined directly by the pockets or may be defined by a housing that is inserted into the pockets. The coolant chambers of the assembly 286 may include flow guide assemblies that are similar to the flow guide assemblies discussed above. FIGS. 12 through 14 illustrated example flow guide assemblies that may be used in power-module assembly 286. The flow guide assemblies shown in FIGS. 12 through 14 may be utilized in either the housing, or no housing, embodiments. In the housing embodiments, the flow guides are attached to the housing, and in the embodiments without the housing, the flow guides are attached to the plates 318 that define the coolant chamber.

Referring to FIG. 12, a housing 332 includes walls 334 defining a coolant chamber 336. The housing 332 includes an inlet opening 338 and an outlet opening 340 allowing coolant to enter and exit the chamber 336. An off-set strip flow guide assembly 330 is received within the chamber 336. The flow guide assembly 330 includes a plurality of strip fins 342 that each includes horizontal panels 344 and vertical panels 346 connected along a bent edge 348. Adjacent fins 342 are arranged offset relative to each other to increase turbulence in the coolant flowing through the coolant chamber 336. The strip fins 342 may be attached to a backing sheet (not shown) or may be directly attached to one of the walls 334 of the housing 332.

Referring to FIG. 13, a straight fin flow guide 350 is receivable within one of the coolant chambers of power-module assembly 286. The flow guide 350 includes a plurality of straight fins 352 that extend between the inlet and the outlet of the coolant chamber. A mid-plate 354 may be attached to each of the fins 352. The mid-plate 354 holds the fins 352 in position and may also act as a fin itself. Alternatively, the mid-plate 354 may be omitted and replaced with a backing sheet that is attached to each of the fins along an upper or lower longitudinal edge of the fins.

Referring to FIG. 14, a pin fin flow guide assembly 356 is receivable within the one of the coolant chambers of the power-module assembly 286. The assembly 356 includes a first set of pin fins 358 that are attached to a mid-plate 360 and extend upwardly therefrom. A second set of pin fins 362 are attached on the other side of the mid-plate 360 and extend downwardly therefrom. The first and second pin sets may be arranged such that the pins of the first set are concentric with corresponding pins of the second set. The pins may have a circular cross-section or may have a polygonal cross-section.

Figure 15:
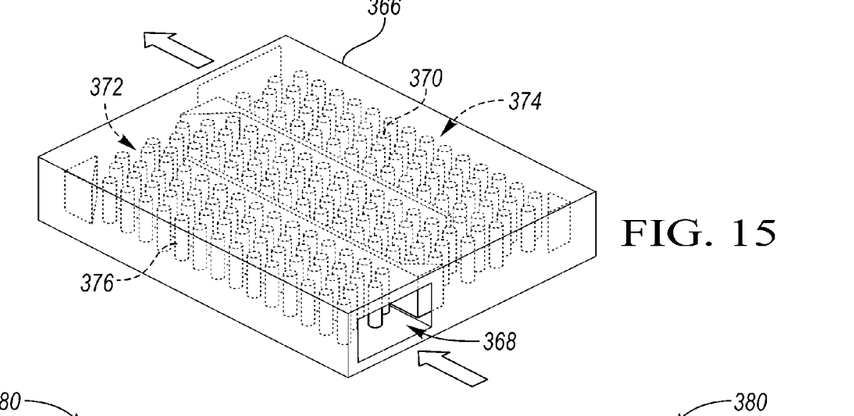
FIG. 15 is a perspective view of yet another pin fin flow guide assembly.

Referring to FIG. 15, the coolant chambers of power-module assembly 286 may include a four turn flow path. The housing 366 includes walls defining the coolant chamber 368. A flow guide assembly 370 is disposed within the chamber 368 to direct coolant flowing within the chamber. The flow guide assembly 370 may include bends 372 and straight segments 374 creating a serpentine coolant channel within the chamber 368. The assembly 370 may include a plurality of fins 376. The fins 376 may be pin fins (as shown), or may be one of the other types of fins described above, or may be any type of fin known by a person skilled in the art. The fins 376 may be arranged to facilitate serpentine flow within the chamber. For example, the fins 376 may be arranged in U-shaped patterns at the bends 372 and in straight rows in the straight segments 374. Some of the pins may be attached to the top of the housing 366 and some may be attached to the bottom of the housing 366. Or, all of the pins may be attached to both. Or all of the pins may be attached to one of the top or bottom.

Figure 16A:
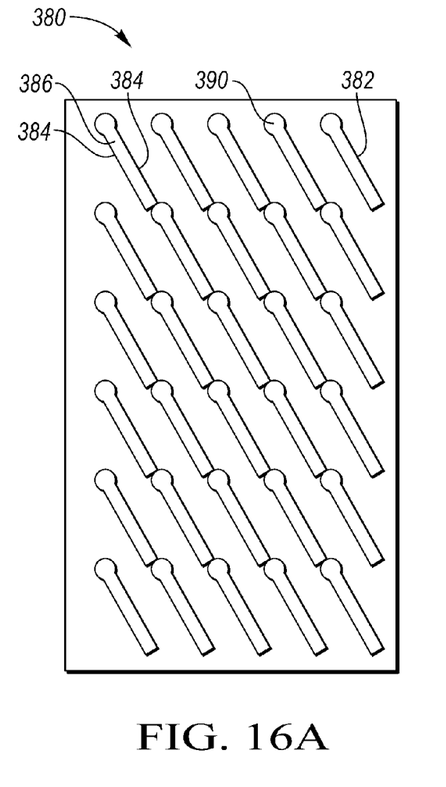
FIG. 16A is a plan view of flow guide assembly having variable shaped fins that have a first shape.
Figure 16B:
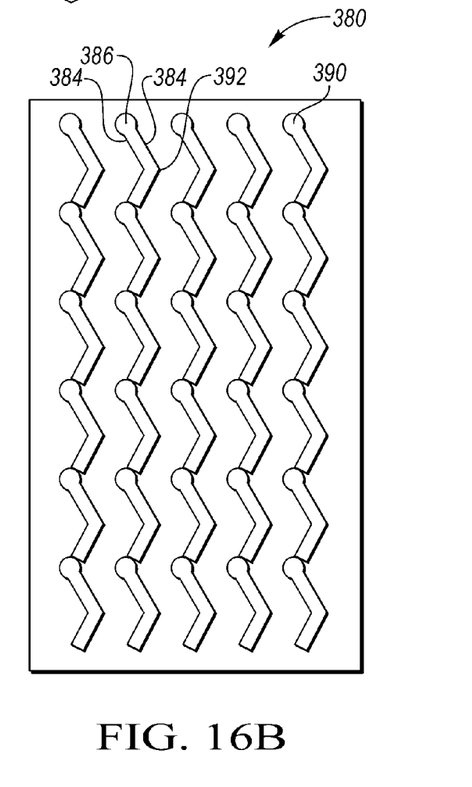
FIG. 16B is a plan view of the flow guide assembly of FIG. 16A with the fins in a second shape.

FIGS. 16A and 16B illustrate a flow guide 380 having variable shaped fins 382. FIG. 16A illustrates the fins 382 in a first position and FIG. 16B illustrates the fins 382 in a second position. One purpose of the fins 382 is to increase turbulence in the coolant within the coolant chambers. Generally, the cooling capacity of the coolant chambers can be increased by increasing turbulence in the coolant. But, increased turbulence causes increased resistance within the coolant chambers requiring more pumping power to circulate coolant through the system. The cooling demands for any device, including power inverters, vary during the work cycle of the device. It is ideal to only increase turbulence when additional cooling is needed to reduce workload on the pump. By adjusting the position of the fins, turbulence can be increased or decreased as needed, and unnecessary pumping losses may be reduced.

Each of the fins 382 includes a pair of opposing panels 384 extending between the top 386 and a bottom of the fin. The panels 384 are the portion of the fin that interfaces most with the coolant circulating through the chamber. Each of the fins 382 also includes an attachment region 390 where the fin is attached to either the housing (if included) or to one of the plates. The attachment region is small enough to allow a substantial portion of the fin 382 to move relative to the housing or plate.

The fins 382 may be made of a material configured to change shape in response to a change in temperature. For example, the fins 382 may be made of a bimetal material, or may be made of shape-memory alloys. Bimetal materials and shape-memory alloys are materials that mechanically displace in response to a change in temperature. The fins 382 may be configured to be in the first position for a lower range of temperatures and in the second position for a higher range of temperatures.

In the first position, the panels 384 of each of the fins 382 are substantially straight. In response to an increase in temperature, each of the fins 382 may displace to the second position. In the second position, the panels 384 of each of the fins 382 include at least one bend 392. The bent shape of the fins in the second position creates more turbulence than the first position, which increases cooling capacity of the coolant chamber. The fins may be configured to switch positions at different temperatures providing even greater control over turbulence. For example, half of the fins may switch to the second position at a first temperature, and the other half may switch to the second position at a second temperature.

While the variable shaped fins are illustrated as part of a power-module assembly for a power inverter, the variable shaped fins may be used in other power electronic devices. For example, flow guide assembly 380 may be used in a traction battery assembly. Here, the flow guides may be interleaved between battery cells to cool the battery cells.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A power inverter comprising:
   power modules each including opposing major sides that each define a pocket recessed therein, and being arranged in a stack such that pockets adjacent to each other cooperate to form coolant chambers interleaved with the modules; and
   flow guide assemblies each disposed within one of the coolant chambers and including fins configured to alter shape based on a temperature of the coolant to alter a turbulence associated with the coolant.

2. The power inverter of claim 1 further including a plurality of housings each received within one of the chambers and defining a cavity for receiving one of the flow guide assemblies therein.

3. The power inverter of claim 1 wherein each of the flow guide assemblies further includes a barrier defining an inlet side of the coolant chamber and an outlet side of the coolant chamber.

4. The power inverter of claim 3 wherein each of the coolant chambers defines a return region between the inlet and outlets sides, and wherein the fins are arranged to form U-shaped coolant flow paths.

5. The power inverter of claim 1 wherein each of the coolant chambers includes an inlet and an outlet disposed on a same side.

6. The power inverter of claim 1 further comprising a manifold extending along a length of the stack and in fluid communication with each of the coolant chambers.

7. The power inverter of claim 6 wherein each of the modules defines an opening and the manifold is disposed within each of the openings.

8. A power inverter comprising:
   a plurality of power modules each including a power stage having opposing major sides and minor sides connecting between the major sides, the minor sides being surrounded by a frame that extends past both of the major sides such that the frame and the power stage cooperate to define pockets that are each recessed into a side of the power module, wherein the power modules are arranged in a stack such that frames adjacent to each other are in contact with each other, and pockets adjacent to each other cooperate to form coolant chambers that are interleaved with the power modules; and
   fins disposed in each of the coolant chamber and projecting into a coolant path of each of the chambers, the fins being configured to alter shape based on a temperature of the coolant to alter a turbulence associated with the coolant.

9. The power inverter of claim 8 wherein the fins are further configured to have a first shape for a first range of temperatures of the coolant and a second shape for a second range of temperatures of the coolant.

10. The power inverter of claim 8 wherein the fins are made of bimetal material configured to mechanically displace in response to a change in the temperature.

11. The power inverter of claim 8 wherein the fins are made of shape-memory alloy configured to mechanically displace in response to a change in the temperature.

12. The power inverter of claim 8 further comprising a manifold extending along a length of the stack and being in fluid communication with each of the coolant chambers.

13. The power inverter of claim 12 wherein each of the power modules includes an opening defined by one of the minor sides and the frame, where each of the openings receives a portion of the manifold therein.

14. The power inverter of claim 8 wherein each of the coolant chambers is defined by a housing received between power modules that are adjacent to each other and wherein the fins are attached to an interior surface of the housing and project laterally therefrom.

15. The power inverter of claim 14 wherein each of the housings includes an inlet and an outlet disposed on a same side of the chamber.

16. A power inverter comprising:
   a plurality of power modules each including a power stage having opposing major sides and minor sides surrounded by a frame that extends past both of the major sides and cooperates with the major sides to define pockets on each side of the power module, the power modules being arranged in a stack such that pockets adjacent to each other cooperate to form cavities that are interleaved with the power modules, wherein each of the power modules further includes a manifold opening defined by one of the minor sides and the frame, the power modules being stacked such that the manifold openings are in alignment with each other and cooperate to define a manifold slot along a length of the stack;
   a manifold received in the manifold slot and extending through each of the manifold openings; and
   a plurality of flow guide assemblies each disposed in one of the cavities and in fluid communication with the manifold.

17. The power inverter of claim 16 wherein each of the flow guide assemblies further includes a housing have opposing major sides that are each in contact with a corresponding one of the major sides of one of the power stages.

18. The power inverter of claim 17 wherein each of the flow guide assemblies further includes fins extending between the opposing major sides of the housing.

19. The power inverter of claim 18 wherein the fins are configured to alter shape based on a temperature of coolant circulating through the housing.

20. The power inverter of claim 18 wherein the fins are made of bimetal material configured to mechanically displace in response to a change in temperature.

* * * * *